United States Patent [19]

Thomas

[11] Patent Number: 5,170,486
[45] Date of Patent: Dec. 8, 1992

[54] APPARATUS FOR SYNTHESIZING A COMPOSITE RF SIGNAL SUITABLE FOR USE AS A TEST SIGNAL IN TESTING ADJACENT CHANNEL REJECTION OF RADIO RECEIVERS

[75] Inventor: Neil E. Thomas, St. Albans, United Kingdom

[73] Assignee: Marconi Instruments Limited, England

[21] Appl. No.: 502,752

[22] Filed: Apr. 2, 1990

[30] Foreign Application Priority Data

Apr. 21, 1989 [GB] United Kingdom ............ 8909127.6
Oct. 20, 1989 [GB] United Kingdom ............ 8923685.5

[51] Int. Cl.$^5$ .......................................... H04B 17/00
[52] U.S. Cl. ..................................... 455/44; 455/67.4; 455/103; 455/295
[58] Field of Search ............... 455/44, 67, 102, 115, 455/206, 295, 103, 67.1, 67.4; 332/119

[56] References Cited

U.S. PATENT DOCUMENTS

| | | | |
|---|---|---|---|
| 2,233,183 | 2/1941 | Roder | 332/119 |
| 2,675,540 | 4/1954 | Schultheis et al. | 332/119 |
| 3,623,105 | 11/1971 | Kamen | 455/102 |
| 4,110,708 | 8/1978 | Mendehhall | 332/119 |
| 4,130,811 | 12/1978 | Katz et al. | 332/18 |
| 4,806,881 | 2/1989 | Ives et al. | 455/102 |
| 4,918,684 | 4/1990 | Boschet et al. | 455/295 |

FOREIGN PATENT DOCUMENTS 2011206 7/1979 United Kingdom .

OTHER PUBLICATIONS

Electro. No. 76, 1976, Los Angeles, U.S., pp. 1-6, W. H. Hayward: "Modern trends in communication receiver design-an overview".

Primary Examiner—Reinhard J. Eisenzopf
Assistant Examiner—Edward Urban
Attorney, Agent, or Firm—Kirschstein, Ottinger, Israel & Schiffmiller

[57] ABSTRACT

Apparatus for synthesising a composite signal (53) which has spaced first and second frequency channels of which each has an independently predetermined power, the power of the first channel being substantially below that of the second, and each channel being frequency modulated by an independent signal, the apparatus including a generator (51) responsive to the independent signals and to representations of the said powers and to the channel spacing to generate a composite modulation signal, and a single, high purity radio frequency source (52) connected for modulation by the output of the composite modulation signal-generating generator to produce the composite signal (53).

10 Claims, 2 Drawing Sheets

APPARATUS FOR SYNTHESIZING A COMPOSITE RF SIGNAL SUITABLE FOR USE AS A TEST SIGNAL IN TESTING ADJACENT CHANNEL REJECTION OF RADIO RECEIVERS

BACKGROUND OF THE INVENTION

1. Field of the Invention

This invention relates to apparatus for generating a signal which has spaced first and second frequency channels of which each has an independently predetermined power, the power of the first channel being substantially below that of the second, and each channel carrying frequency modulation with an independently predetermined modulation rate and deviation. Such signals are particularly useful as test signals for testing adjacent channel rejection of radio receivers.

2. Description of Related Art

Adjacent channel rejection is a measure of the capability of a radio receiver to ignore strong signals in an adjacent channel (the second channel) while receiving a weak signal in the wanted channel (the first channel). This situation might arise where a radio is receiving transmissions at the very limit of one transmitter's range, while a nearby transmitter is transmitting on the next frequency channel. Typical channel spacings are 12.5 kHz, 20 kHz and 25 kHz. Typical radio receivers using frequency modulation allow peak frequency deviations of 2.5 kHz for 12.5 kHz spacings, and 5 kHz for 20 kHz or 25 kHz spacings.

Conventional equipment for testing the adjacent channel rejection of such radio receivers is illustrated in FIG. 1 of the accompanying drawings. The wanted signal channel comprises a frequency modulation source 14 connected to modulate a radio frequency source 12, whose output is fed by way of a radio frequency attenuator 15 to a combiner 16. The adjacent signal channel, in which the power of modulation is substantially higher, consists of a similar frequency modulation source 13, connected to modulate a relatively high purity radio frequency source 11 whose output is fed directly to the combiner 16. The composite test signal 17 is taken as the output from the combiner 16, and is illustrated diagrammatically in FIG. 2 of the accompanying drawings.

FIG. 2 illustrates the power spectrum in the region of the wanted channel at frequency $F_W$, and the adjacent channel at frequency $F_{ADJ}$. As a typical specification for the adjacent channel rejection may be 70 dB, the generator used for the high power signal, RF source 11, must have very good spectral purity. It must be at least 20 dB better in sideband performance at an offset corresponding to the channel spacing than the rejection specification to be measured. The signal generator, RF source 12, for the wanted channel need not have such a high specification for spectral purity.

The test is typically performed by adjusting the level of the wanted channel generator, modulated with typically 60% maximum deviation at 1 kHz, to give a 12 dB SINAD (signal to noise and distortion radio) on the receiver under test. This radio frequency level is now increased by 6 dB. The adjacent channel power, modulated at typically 60% maximum deviation at 400 Hz, is increased until the receiver returns to 12 dB SINAD. The radio of these two powers, represented in FIG. 2 as the adjacent channel power ratio 20, is known as the adjacent channel rejection.

The problem with conventional test signal generators is that they require the use of two signal generators 11, 12. This yields an uncertainty in the power difference which equals the sum of the uncertainties in the power level of each generator, the gain of the attenuator 15, and the balance of the combiner 16. The resulting uncertainty can be very large.

SUMMARY OF THE INVENTION

The invention overcomes this problem by providing apparatus for synthesising a composite RF signal which has spaced first and second frequency channels of which each has an independently determined power, the power of the first channel being substantially below that of the second, and each channel being frequency modulated by an independent signal, the apparatus comprising means responsive to the independent signals and to representations of the said channel frequency spacing and powers to generate a composite modulation signal, and a single, high purity radio frequency source connected for modulation by the output of the composite modulation signal generating means to produce the composite RF signal.

One or both of the independent modulation signals may comprise a predetermined signal, e.g. a single tone or multiple tones. However, one or both of them may instead comprise an input signal supplied to the composite modulation signal generating means; in other words, the signals may be arbitrary.

In one example, each channel carries frequency modulation with an independently-predetermined modulation rate and deviation, the composite modulation signal generating means being responsive to representations of the said predetermined powers, rates and deviations and to the channel frequency separation.

The invention allows a composite signal, such as the test signal for testing adjacent channel rejection of radio receivers, to be generated using only a single signal generator. The benefits of the use of the invention in apparatus for generating a test signal for adjacent channel rejection are twofold. The first advantage is the obvious saving in equipment, since only one generator is required in place of two generators plus a combiner. Secondly, the accuracy is greatly improved; the power ratio of the wanted to the adjacent channels depends only on the FM accuracy of the generator and that of the audio attenuator which would be used in the FM chain in a practicable implementation.

The frequency modulations are preferably at audio frequencies.

The apparatus preferably comprises operator-adjustable means for varying the power of the channels (for example in order to carry out an adjacent channel rejection test).

Since frequency modulation is preferable to amplitude modulation or combined frequency and amplitude modulation in most practicable implementations, it is preferable that the composite modulation signal is a frequency-modulation signal. In this case, the composite frequency-modulation signal-generating means preferably comprises electronic circuitry implementing the geometric equations disclosed below in the description of a preferred embodiment of the invention.

BRIEF DESCRIPTION OF THE DRAWINGS

One way in which the invention may be performed will now be described, by way of example only, with reference to the accompanying diagrammatic drawings, in which.

DETAILED DESCRIPTION OF THE PREFERRED EMBODIMENT

Figure 1:
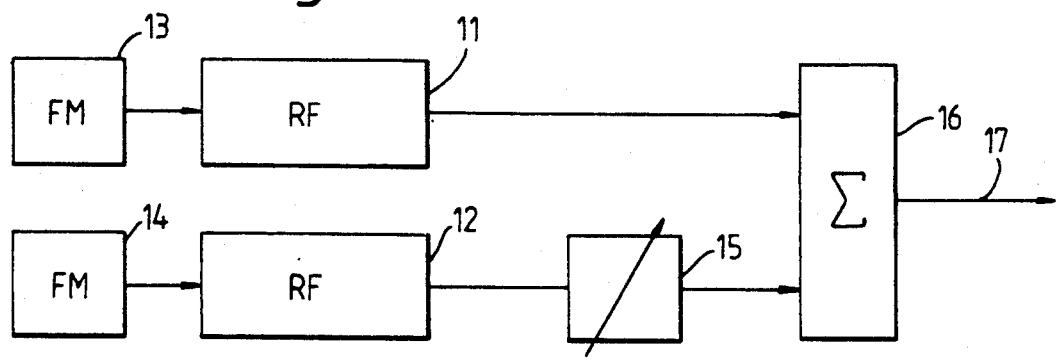
FIG. 1, to which reference has already been made, is a block diagram of conventional apparatus according to the prior art for generating a test signal for adjacent channel rejection testing of radio receivers.
Figure 2:
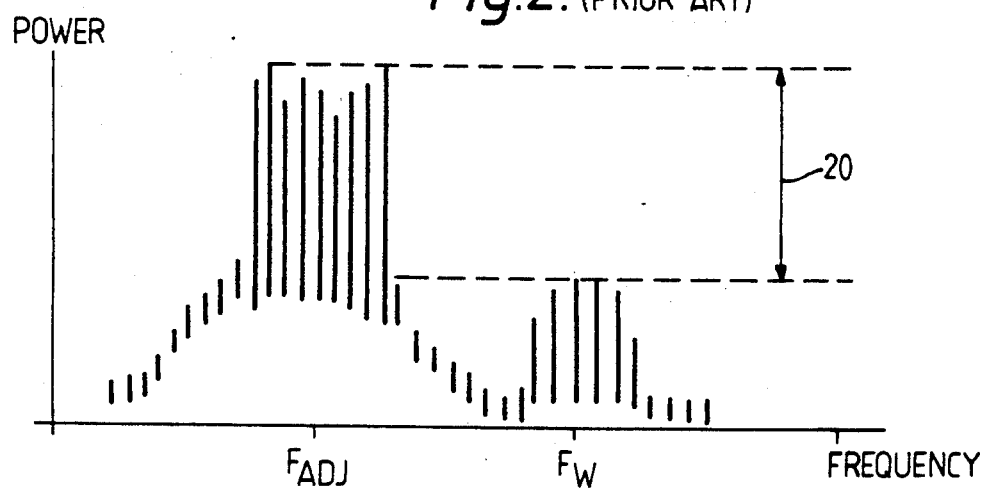
FIG. 2, to which reference has also been made, is a representation of the power spectrum of the composite test signal generated by the prior art apparatus of FIG. 1.

In the example to be described, the test signal consists of two audio frequency modulations in respective adjacent channels separated by 12.5 kHz, on a carrier frequency of, for example, 1.7 MHz. With reference to FIG. 2, a 400 Hz signal is used to modulate the adjacent channel at frequency $F_{ADJ}$, and a frequency of 1 kHz is used to modulate the wanted channel at $F_W$, where $F_w - F_{ADJ} = 12.5$ kHz. The apparatus to be described below with reference to FIGS. 3, 4, and 5 uses a method for distorting a 12.5 kHz signal such that when it is added to a 400 Hz signal and frequency-modulated onto a carrier, the distortion cancels out the cross-modulation sidebands to yield a usefully pure test signal. The signal is usefully pure if it exceeds 12 dB SINAD by a sufficient margin, and a typical target for this technique is reliability to achieve 20 dB SINAD.

Figure 5:
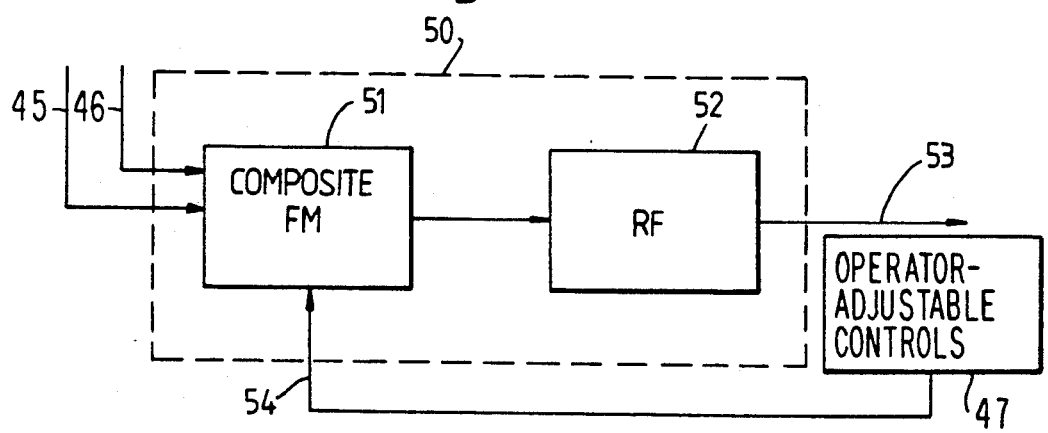
FIG. 5 is a schematic block diagram illustrating the preferred embodiment of the invention.

The test signal generating apparatus 50, shown in FIG. 5, consists of a composite frequency-modulation signal generator 51 whose output is connected so as to modulate a high purity RF source 52, whose output 53 is the test signal. The variables in the generation of the composite FM signal consist of the frequency modulation rate and modulation deviation of the wanted channel 45 and the adjacent channel 46 respectively; these typically do not require to be changed. Other variables, such as the frequency spacing and the relative power of the two channels, are received by the composite FM signal generator 51 as an input 54, for example from operator-adjustable controls 47.

The function of the composite frequency-modulation signal generator 51 will now be described with reference to FIGS. 3 and 4. In the description below, the following symbols are used:

$\phi_c$, $\phi_w$ and $\phi_{adj}$ are respectively the phasors of the carrier signal, the wanted channel signal and the adjacent channel signal;

w1 is the radian frequency channel separation;

w2, b2 are respectively the radian modulation rate and the modulation index for the wanted channel;

w3, b3 are respectively the radian modulation rate and the modulation index for the adjacent channel;

amp is the amplitude of the wanted channel normalised to the adjacent channel amplitude;

t is the time in seconds.

Conventionally, the phase origin is to the right, and phase increases counter-clockwise.

Figure 3:
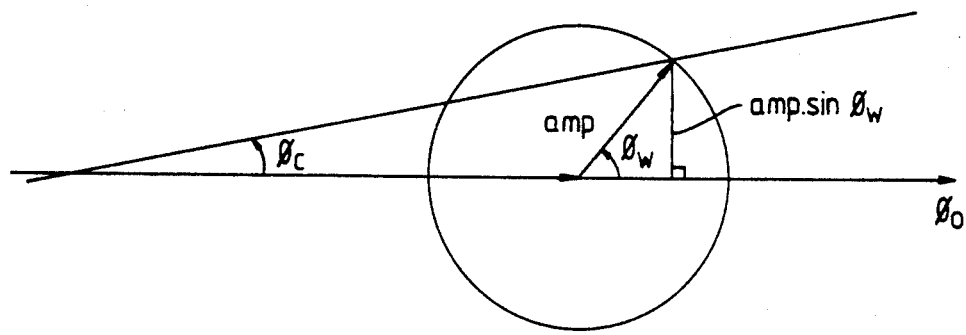
FIGS. 3 and 4 are phasor diagrams illustrating the operation of circuitry embodying the present invention.

With reference to FIG. 3, consider first the generation of the wanted channel with no modulation on the adjacent channel. The wanted channel power is very small, hence amp is very much smaller than 1. The phasor corresponding to the carrier on the adjacent channel is stationary at zero phase. The phase of the wanted channel phasor $\phi w$ can be written as the sum of two parts; the first part is the steady increase of phase at w1, and the second is the phase modulation at w2. The sum of these, $\phi w$ is written:

$$\phi w = w1.t + b2.\sin(w2.t) \qquad (i)$$

When this modulation phasor is added to the carrier phasor, the result is a modulation in both phase and amplitude. The phase modulation is given exactly by:

$$\phi c = \arctan(\text{amp}.\sin(\phi w)/(1 + \text{amp}.\cos(\phi w)))$$

This is a complicated expression. Where amp < 1, then $(1 + \text{amp}.\cos(\phi w))$ approximates to 1, and arctan $(\text{amp}.\sin(\phi w))$ approximates to $\text{amp}.\sin.(\phi w)$, yielding:

$$\phi c + \text{amp}.\sin(w1.t + b2.\sin(w2.t)) \qquad (ii)$$

It will be noted that the phase modulation of the carrier is resolved at right angles to the carrier. The since term in equation ii) above resolves the phase modulation in the vertical direction.

Figure 4:
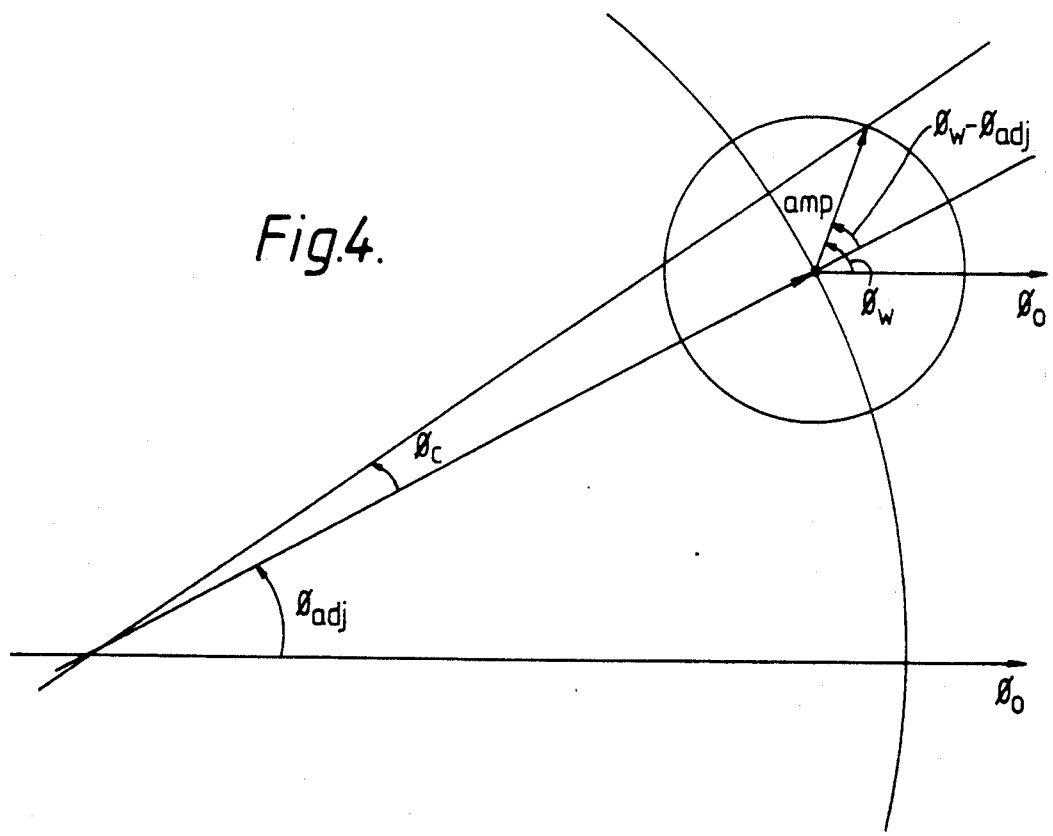

With reference now to FIG. 4, the carrier is itself modulated at a large modulation index b3 by the signal at w3. The carrier phase no longer remains at phase zero, and its phase and frequency can be written:

$$\phi adj = b3.\sin(w3.t) \qquad (iii)$$

$$FMadj = b3.w3.\cos(w3.t) \qquad (iv)$$

This modulation on the phasor of the adjacent channel does not affect the phase of the wanted channel. However, the change in phase that the wanted channel makes on this large phasor is still at right angles to the large phasor, and is no longer vertical as in the case of FIG. 3 with no adjacent channel modulation. In order to resolve the change of phase at right angles to the large phasor, the angle of this phasor must be subtracted from the argument of the sine expression:

$$\phi c = \text{amp}.\sin(w1.t + b2.\sin(w2.t) - b3.\sin(w3.t)) \qquad (v)$$

Frequency modulation is preferable to phase modulation in practical test signal generation due to its better dynamic range and accuracy. Accordingly, the frequency modulation is derived from the phase modulation equation v) by differentiation with respect to time:

$$FMc = \text{amp}.\cos(w1.t + b2.\sin(w2.t) - b3.\sin(w3.t)).$$
$$(w1 + b2.w2.\cos(w2.t) - b3.w3.\cos(w3.t)) \qquad (vi)$$

The composite modulation that must be used to frequency-modulate the RF 52 is given by the sum of the modulation of the adjacent channel and the wanted channel:

$$FMtotal = FMc - FMadj \qquad (viii)$$

This equation represents the composite FM generated by the generator 51 of FIG. 5 which will generate the wanted channel at a frequency of w1 above the adjacent channel. If, however, the test were to be applied to an adjacent channel above the wanted channel, then the wanted channel could be generated below the adjacent channel by using, instead of equation vii), the following:

$$FM_{total} = FM_c - FM_{adj}$$

If an RF generator with AM and FM capability were to implement the amplitude and phase modulations implied by the phasor diagrams of FIG. 3 and FIG. 4, then the resultant composite signal would indeed consist only of the two channels as shown in FIG. 2. However, using an RF generator with only FM capability in effect ignores the amplitude modulation, as in the derivation of Equation (ii) above. This reduces the power of the wanted channel by 6 dB, and creates a third channel at a frequency of $F_W - 2/F_W - F_{ADJ}/$, i.e. the wanted frequency minus twice the channel spacing. This third channel is of no consequence as it is two channel spacings from the wanted channel, and of equivalent power to the wanted channel.

In the preferred form, these equations iv), vi) and vii) or viii), representing approximated algebraic derivations of the required frequency modulation, are implemented in ROM (read only memory) look-up audio sources in otherwise conventional equipment. For example, in test equipment which already includes a dual audio source, a digital phase accumulator ROM look-up audio source may be fitted with a look-up table representing FMc (equation vi) instead of its conventional sine-look-up table. The other audio source may be used to produce FMadj (equation iv) and the two can be summed together in an appropriate ratio to produce FM total (equation vii or viii) at any predetermined value of the amplitude amp.

Alternatively, equations iv), vi) and vii) or viii) may be implemented directly on a digital signal processor in real time.

In a further alternative, there is no need to rely on the approximations given in the equations above. It is possible to use a digital signal processor (DSP) to model the phasor addition that would result from the modulation of two independent arbitrary signals onto a wanted channel and an adjacent channel, and to differentiate the phase of the result to yield the required composite modulation signal. Where the modulation on each channel is predetermined, this FM could be stored in a ROM for later use. Where the modulation is arbitrary, the DSP will need to work in real time.

An exact version of Equation (v) would be:

$$\phi_c = \arctan\left(\frac{amp \cdot \sin(w1 \cdot t + b2 \cdot \sin(w2 \cdot t) - b3 \cdot \sin(w3 \cdot t))}{(1 + amp \cdot \cos(w1 \cdot t + b2 \cdot \sin(w2 \cdot t) - b3 \cdot \sin(w3 \cdot t))}\right) \quad \text{ix)}$$

and an exact version of Equation (vi) would be the differential of this expression:

$$FM_c = \frac{amp}{1 + amp^2}(amp + \cos(w1 \cdot t + b2 \cdot \sin(w2 \cdot t) - \quad \text{x)}$$

$$b3 \cdot \sin(w3 \cdot t)) \times (w1 + b2 \cdot w2 \cdot$$

$$\cos(w2 \cdot t) - b3 \cdot w3 \cdot \cos(w3 \cdot t))$$

It is envisaged that direct analogue generation would also be possible. In practice the difficulty with parameter tracking would mean that this method would be much more expensive than the direct digital methods described above. Further, a digital/analogue hybrid scheme is envisaged, in which an array of discrete digital oscillations with either digital multipliers or analogue scaling would be used to form the final signal.

If the method described above were implemented using FOM stored data, then only fixed channel spacings with predetermined modulations would be available. However, it would be feasible to store several wave-forms, one for each channel spacing: this is perfectly practical, as the adjacent channel rejection test usually uses the same modulation frequencies and maximum frequency deviations.

Where the apparatus accepts arbitrary input signals for the independent FM channels, those signals could be speech signals, and the apparatus could be used in the subjective assessment of the adjacent channel performance of a real radio receiver under speech conditions.

I claim:

1. Apparatus for synthesizing a composite RF signal suitable for use as a test signal in testing adjacent channel rejection of radio receivers, the composite RF signal having first and second frequency channels spaced apart by a channel frequency spacing, each channel having an independently determined power, the power of the first channel being substantially below that of the second channel, the first channel being frequency modulated by a first independent signal, the second channel being frequency modulated by a second independent signal, the apparatus comprising: composite modulation signal generating means having an output and being responsive to said first and second independent signals and to representations of the channel frequency spacing and the powers of the channels to generate a composite modulation signal; and a single, high purity radio frequency source connected for modulation by the output of the composite modulation signal generating means to produce the composite RF signal; said composite modulation signal generating means including means for producing in response to said representation of the channel frequency spacing a channel spacing signal of the frequency of said channel spacing, means for distorting said channel spacing signal in dependence on said first and second independent signals to produce a distorted channel spacing signal, and means for adding the distorted channel spacing signal to one of said first and second independent signals to produce said composite modulation signal, said distortion of said channel spacing signal being such that said composite modulation signal produced modulates said radio frequency source such that said spaced first and second frequency channels of said composite RF signal carry independent modulation.

2. Apparatus according to claim 1, in which at least one of the first and second independent modulation signals comprises a predetermined signal.

3. Apparatus according to claim 1, in which at least one of the first and second independent modulation signals comprises an input signal supplied to the composite modulation signal generating means.

4. Apparatus according to claim 2, in which each channel carries frequency modulation with an independently-predetermined modulation rate and deviation, the composite modulation signal generating means being responsive to representations of the said predetermined powers, rates and deviations and to the channel frequency separation.

5. Apparatus according to claim 1, in which the frequency modulations are at audio frequencies.

6. Apparatus according to claim 1, comprising operator-adjustable means for varying the power of the channels.

7. Apparatus according to claim 1, in which the composite modulation signal is a frequency-modulation signal.

8. Apparatus according to claim 7, in which the composite frequency modulation signal-generating means comprises electronic circuitry implementing the following equations or the equivalent exact equations:

$$FMadj = p3.w3.\cos(w3.t)$$

where FMadj is the modulation of the second channel, b3 is the modulation index for said second frequency channel, w3 is the radian modulation rate for the second channel, and t is time in seconds;

$$\phi c = amp.\sin(w1.t + b2.\sin(w2.t) - b3.\sin(w3.t))$$

where $\phi$ is the phasor of the carrier signal provided by said single, high purity radio frequency source, amp is the amplitude of said first frequency channel normalized to the amplitude of the second channel, w1 is the radian frequency channel spacing, b2 is the modulation index for the first channel, and w2 is the radian modulation rate for the first channel; and $$FMtotal = FMc + FMadj,$$

where FMtotal is the composite modulation used to modulate said single, high purity radio frequency source, and FMc is the modulation of the first channel, or $$FMtotal = FMc - FMadj.$$

9. Apparatus according to claim 8, in which the electronic circuitry comprises ROM storing data produced in accordance with said equations.

10. Apparatus according to claim 2, in which at least one of the first and second independent modulation signals comprises an input signal supplied to the composite modulation signal generating means.

* * * * *